(12) United States Patent  
Park

(10) Patent No.: US 6,734,058 B2  
(45) Date of Patent: May 11, 2004

(54) METHOD FOR FABRICATING A SEMICONDUCTOR DEVICE

(75) Inventor: Cheol Soo Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/329,587

(22) Filed: Dec. 26, 2002

(65) Prior Publication Data

US 2003/0124804 A1 Jul. 3, 2003

(30) Foreign Application Priority Data

Dec. 29, 2001  (KR) ........................................ 2001-88235

(51) Int. Cl.[7] .................. H01L 21/8242; H01L 21/336
(52) U.S. Cl. .................. 438/242; 438/212; 438/245; 438/259
(58) Field of Search .................. 438/212, 226, 438/242, 245, 259, 300

(56) References Cited

U.S. PATENT DOCUMENTS

| | | | |
|---|---|---|---|
| 5,291,438 A | * | 3/1994 | Witek et al. ............... 365/149 |
| 5,382,816 A | | 1/1995 | Mitsui |
| 5,547,889 A | | 8/1996 | Kim |
| 5,872,037 A | * | 2/1999 | Iwamatsu et al. ............ 438/268 |
| 6,075,265 A | * | 6/2000 | Goebel et al. ............... 257/296 |
| 6,197,641 B1 | * | 3/2001 | Hergenrother et al. ...... 438/268 |

* cited by examiner

Primary Examiner—Amir Zarabian  
Assistant Examiner—Pamela E Perkins  
(74) Attorney, Agent, or Firm—Timothy J. Keefer; Wildman, Harrold, Allen & Dixon LLP

(57) ABSTRACT

A method for fabricating a semiconductor device comprising forming an insulating layer and a nitride layer sequentially on a semiconductor substrate; selectively removing the layers to form a first contact hole; forming a silicon layer in the first contact hole; forming a trench by selective removal of the silicon layer; forming a source region in the semiconductor substrate and a drain region on the trench; forming a gate oxide layer and gates sequentially at the side walls of the trench; forming a planarization layer on the resultant structure; forming a second contact hole that exposes the gate, the drain region, and the source region; and forming plugs in the exposed second contact hole.

4 Claims, 5 Drawing Sheets

80 90 50 drain line    drain line

METHOD FOR FABRICATING A SEMICONDUCTOR DEVICE

BACKGROUND OF THE INVENTION

1. Field of the Invention

The present invention relates to a method for fabricating a semiconductor device, and more particularly to a method for fabricating a semiconductor device having a cylinder type transistor.

2. Description of the Prior Art

As generally known in the art, a transistor, in particular, an MOS transistor generally belongs to a category of insulated gate field effect transistors (FET) and uses electrons induced on the surface of a silicon substrate opposing a metal (typically polysilicon) gate material in the structure of an MOS (metal oxide semiconductor) capacitor as electrical currents. In such a case, when the carrier is an electron, it is called an N-channel, and when the carrier is a hole, it is called a P-channel.

The MOS transistor is essentially a majority carrier device, and it has a good characteristic as regards its high frequency activation and has advantages in that driving is easy and the circuit design can be simplified due to the electrical insulation of a gate by an insulating layer such as a gate oxide layer.

According to a method for fabricating a transistor in a process for making a semiconductor device in accordance with a conventional art, as shown in FIG. 1, a gate oxide layer 3 is formed on a semiconductor device wherein a field oxide layer has been formed, and a gate electrode 4 is formed on a desired part of the gate oxide layer 3.

Then, low concentration impurities are implanted into the semiconductor substrate by using the gate electrode 4 as an ion implantation mask, thereby forming a low concentration impurity region 5. Next, a spacer is formed so that an insulating layer remains at both sides of the gate electrode 4, by a blanket etching process.

Subsequently, a source/drain region is formed by implanting high concentration impurity into the exposed substrate with using the gate electrode 4 and the spacer 6 as ion implantation masks thereby accomplishing the transistor.

However, according to the fabricating method for a semiconductor device in accordance with the conventional art, several problems occur as follows.

According to the conventional art, production costs have been increased, because the fabricating process of the transistor has become complicated with the increase of the degree of integration. Also, as regards the semiconductor device, junction capacitance and junction leakage currents have been increased, and it has been difficult to isolate the semiconductor devices.

SUMMARY OF THE INVENTION

Accordingly, the present invention has been made to solve the above-mentioned problems occurring in the prior art, and an object of the present invention is to provide a method for fabricating a highly integrated semiconductor device wherein a vertical cylinder type transistor has been formed inside of an epitaxial silicon layer of a cylinder type.

In order to accomplish this object, there is provided a method for fabricating a semiconductor device, comprising the steps of: forming an insulating layer and a nitride layer sequentially on a semiconductor substrate; selectively removing the insulating layer and the nitride layer, resulting in the formation of a first contact hole; forming a silicon layer in the first contact hole after the removal of a part of the insulating layer at the side walls of the first contact hole; forming a trench through selective removal of the silicon layer; forming a source region in the semiconductor substrate and a drain region on an upper part of the trench, after the removal of the nitride layer; forming a gate oxide layer and gates sequentially at the side walls of the trench; forming a planarization layer on the resultant structure to fill the trench; forming a second contact hole that exposes the gate, the drain region, and the source region through selective patterning the resultant structure; and forming plugs in the exposed second contact hole.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
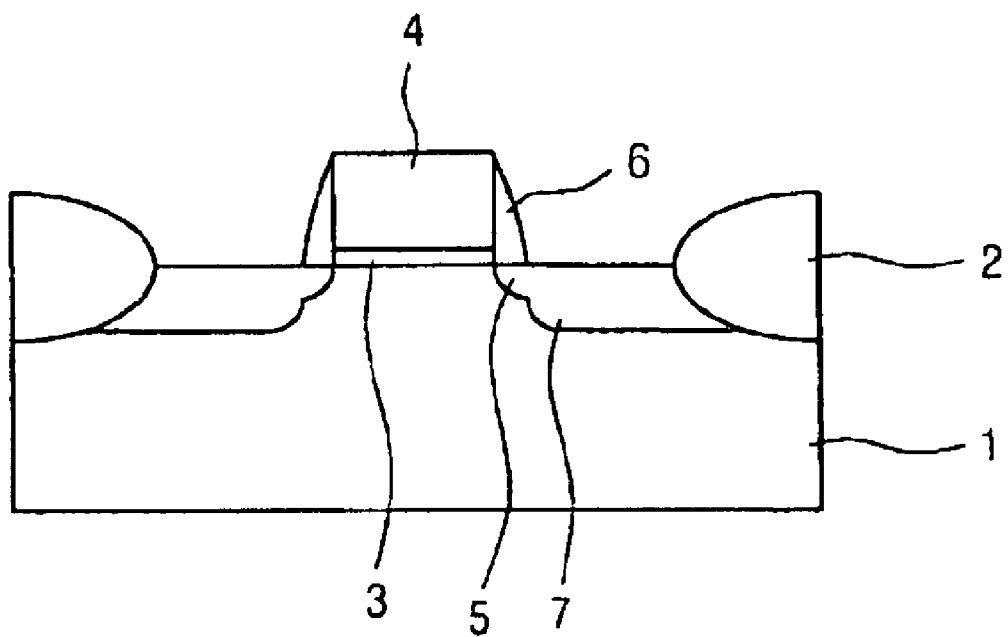
FIG. 1 is a cross-sectional view for illustrating a method for fabricating a semiconductor device in accordance with a conventional art.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2A:
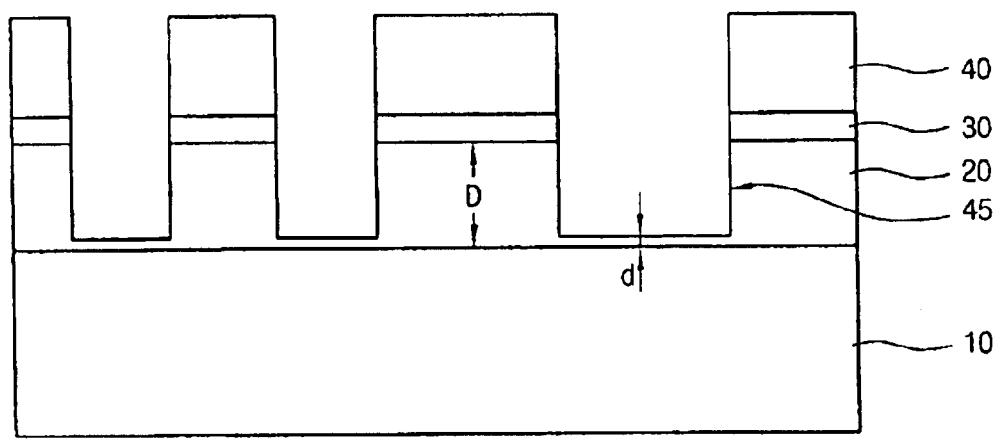
FIGS. 2a to 2e are cross-sectional views for illustrating each step of a method for fabricating a semiconductor device in accordance with the present invention.
Figure 2B:
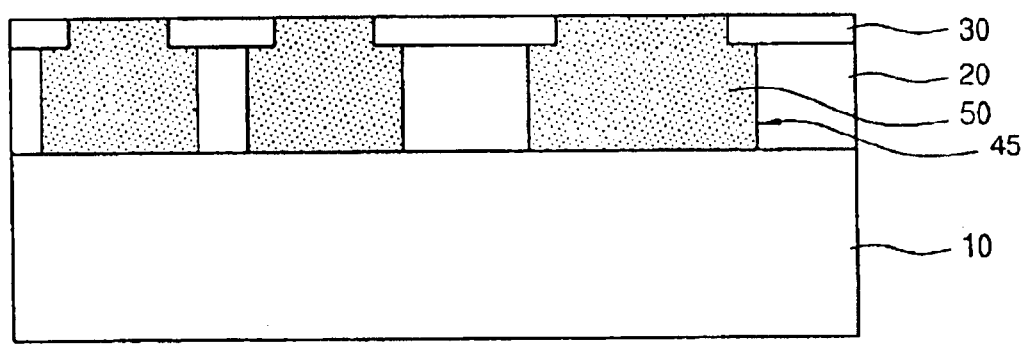
Figure 2C:
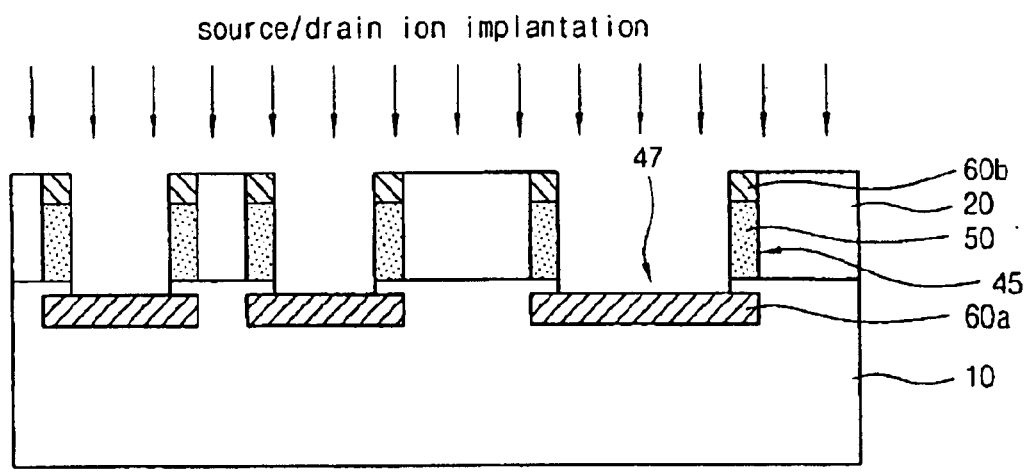
Figure 2D:
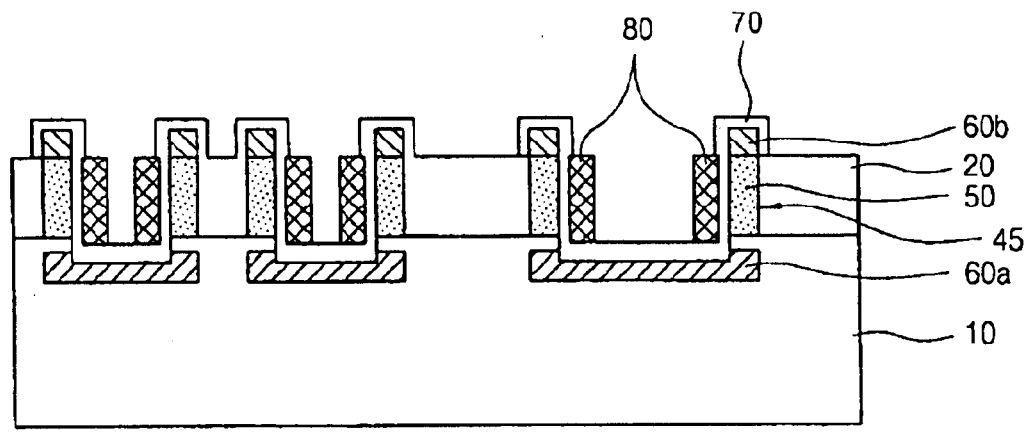
Figure 2E:
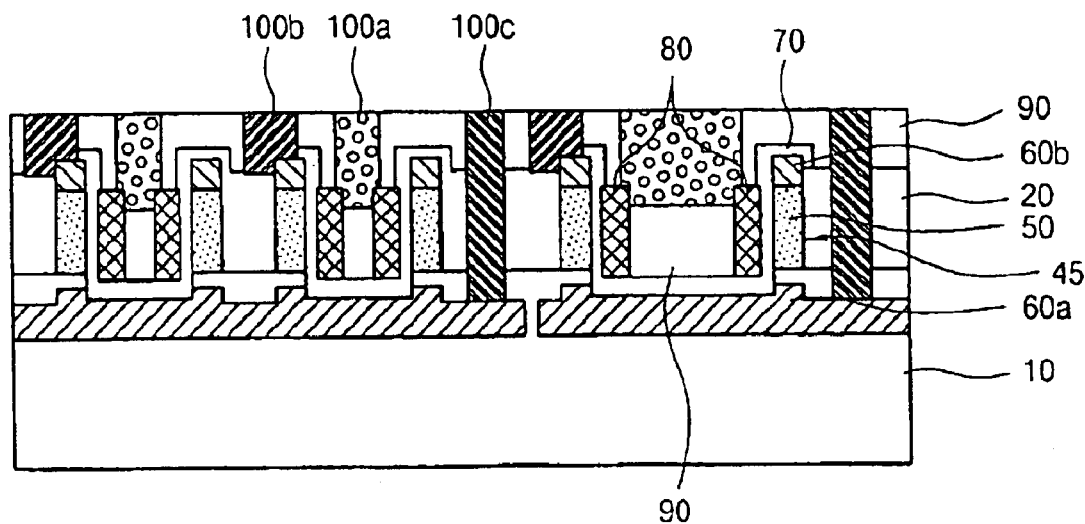
Figure 3:
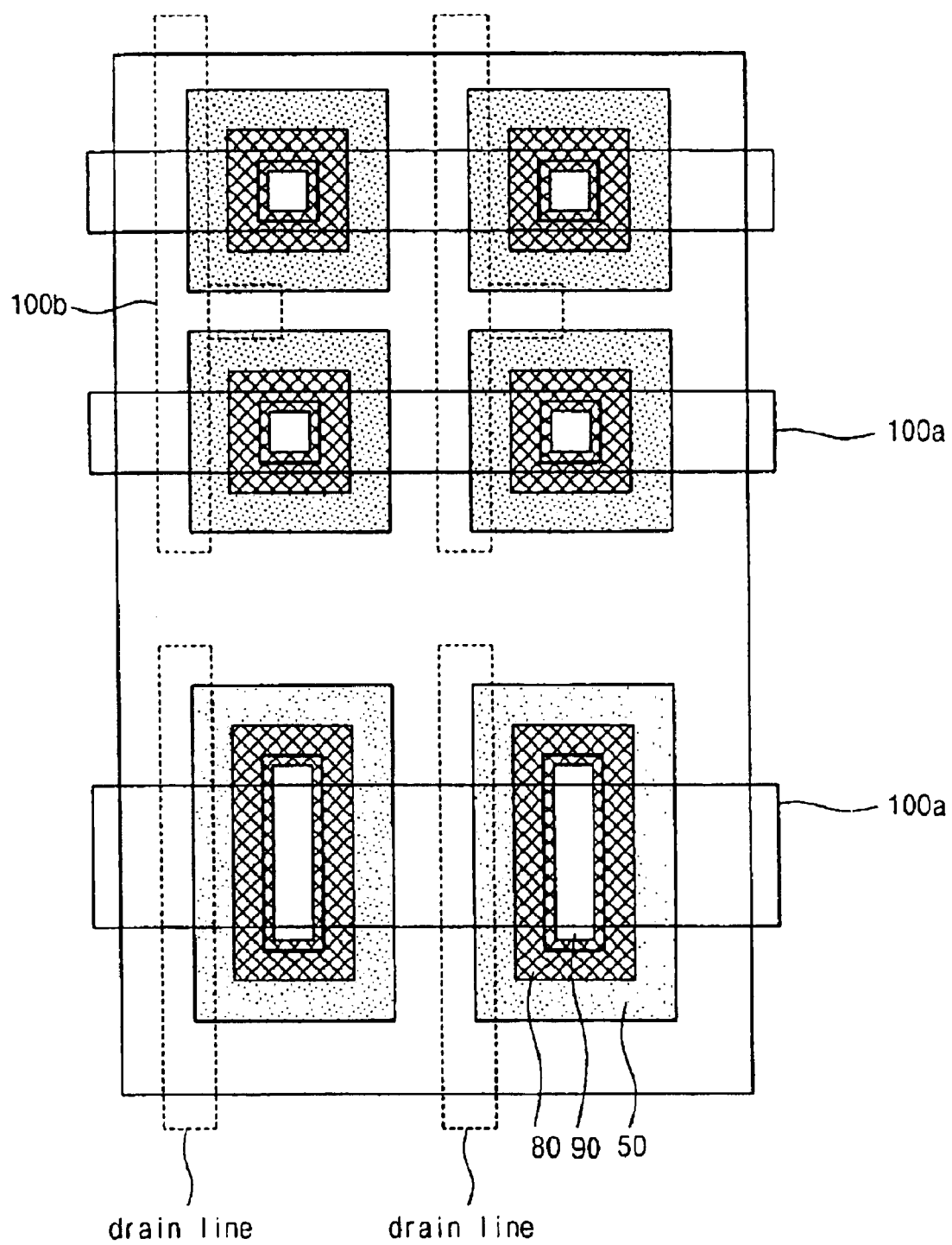
FIG. 3 is a planar view showing the method for fabricating a semiconductor device in accordance with the present invention.

FIGS. 2a to 2e are cross-sectional views for illustrating each step of a method for fabricating a semiconductor device in accordance with the present invention, and FIG. 3 is a planar view showing the fabricating method for fabricating a semiconductor device in accordance with the present invention.

According to the method for fabricating a semiconductor device of the present invention, as shown in FIG. 2a, an insulating layer 20 made of oxide layer is thermally grown to a thickness D of some thousands of Å on a semiconductor substrate 10 made of semiconductor material such as silicon (Si) by a wet oxidation process.

Then, a nitride layer 30 is deposited on the thermally grown insulating layer 20 and a mask pattern is formed on the nitride layer 30, then the nitride layer 30 and the insulating layer 20 are selectively removed through a dry etch process using the mask pattern.

Accordingly, a first contact hole 45 is formed on the semiconductor substrate 10, and the insulating layer 20 is controlled to remain in the first contact hole 45 to a thickness d of some tens to some hundreds of Å during the dry etching process. This is because if the surface of the semiconductor substrate 10 has been exposed during the dry etching process, the exposed surface functions as a defect source.

Referring to FIG. 2b, a part of the insulating layer 20 remained in the first contact hole 45 is removed through a wet etching process, and simultaneously a part of the insulating layer 20 positioned below the nitride layer 30 is removed.

Then, an epitaxial layer 50, e.g. an epitaxial silicon layer, is formed to entirely fill the inside of the first contact hole 45 by doping impurities at an in-situ.

Referring to FIG. 2c, the epitaxial silicon layer 50 is removed selectively by employing the nitride layer 30 as a hard mask and using a high etch selection rate of dry etching for the nitride layer with respect to the epitaxial silicon layer.

Specifically, the epitaxial silicon layer 50 below the nitride layer 30 is left and the exposed epitaxial silicon layer 50 that was not protected by the nitride layer 30 is etched, thereby forming a trench 47. In this instance, the surface of the semiconductor substrate 10 inside of the first contact hole 45 is etched to a desired depth, e.g., some hundreds of Å during the etching process.

Then, the nitride layer 30 that has been used as the hard mask is removed with a hot phosphoric etchant, and an ion implanting process is performed to the surface of the semiconductor substrate 10 in order to form a source/drain region.

Accordingly, a source region 60a is formed below the surface of the semiconductor substrate 10 in the trench 47, and simultaneously a drain region 60b is formed on the epitaxial silicon layer 50.

Referring to FIG. 2d, a gate oxide layer 70 is formed to a thickness of some tens of Å after the formation of a sacrificial oxide layer in the trench 47 and selective removal of the sacrificial oxide layer, and then gates 80 made of metal having a good electrical conductivity are formed vertically to oppose the epitaxial silicon layer 50 while interposing the gate oxide layer 70 in the trench 47.

In this instance, a thermal oxide layer has been grown at the source region 60a and the drain region 60b of more than 5 times than at the gate oxide layer 70 due to doping over about $10^{15}$, and although a sacrificial oxidation is performed, the oxide layer has been grown in the vicinity of the source region 60a and the drain region 60b to a thickness of some hundreds of Å.

Specially, when it is required to control a threshold voltage (Vt), a PSG (phospho-silicate glass) or a BSG (boro-silicate glass) is deposited through a growth process, and removal) of the sacrificial oxide layer and annealing is performed. Then, the threshold voltage may be controlled by means of the annealing temperature or the length of annealing time.

Next, the PSG or the BSG is easily removed with little thermal oxide loss during the process of pre-cleaning of the gate oxide layer, because PSG and BSG have a wet etch selection rate being several tens of that of the thermal oxide layer.

Referring to FIG. 2e, an insulating layer is deposited thickly to fill the trench 47, and a chemical-mechanical polishing (CMP) process is performed, resulting in the formation of a planarization layer 90. Then, a second contact hole is formed by selective removal of the planarization layer 90, and a plurality of plugs 100a, 100b, 100c are formed to fill the second contact hole.

Specifically, a gate plug 100a interconnecting the gate 80, a source plug 100b interconnecting the source region 60a, and a drain plug 100c interconnecting the drain region 60b are formed.

Subsequently, the semiconductor device is accomplished by performing the predetermined following processes.

As shown in FIG. 3, gate lines connected by the gate plug 100a are configured to form a rectangle extended vertically, and drain lines connected by the drain plug 100b are configured to form a rectangle extending horizontally in a semiconductor device fabricated by the process of the present invention described above.

Meanwhile, the gate 80 is constructed to include the planarization layer 90 and configured to be surrounded by the epitaxial layer 50 defining an active region and a field layer, and a plurality of patterns configured in a rectangular form are formed on the semiconductor substrate 10.

As described above, according to the method for fabricating a semiconductor device of the present invention, a highly integrated semiconductor device can be produced through forming a cylindrical epitaxial silicon layer on the substrate and arranging a vertical cylinder type transistor at inside of the epitaxial silicon layer.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, comprising the steps of:

forming an insulating layer and a nitride layer sequentially on a semiconductor substrate;

selectively removing said insulating layer and said nitride layer, to form a first contact;

forming a silicon layer on the structure including the first contact hole, the silicon layer is formed by epitaxial growth manner;

forming a trench through selective removal of said silicon layer;

forming a source region in said semiconductor substrate and a drain region on an upper part of said silicon layer, after the removal of the nitride layer;

forming a gate oxide layer and gate sequentially at the side walls of the trench;

forming a planarization layer on the resultant structure to fill the trench;

forming a second contact hole that exposes said gate, said drain region, and said source region by selective patterning the resultant structure; and forming plugs in said exposed second contact hole.

2. The method for fabricating a semiconductor device according to claim 1, wherein removing said portion of insulating layer at the said walls of the first contact hole is using wet etching process.

3. The method for fabricating a semiconductor device according to claim 1, wherein said first contact hole is formed by a dry etching process.

4. The method for fabricating a semiconductor device according to claim 1, wherein the silicon layer is formed through doping impurities at an in-situ.

* * * * *